United States Patent
Matsumoto et al.

(10) Patent No.: US 10,096,590 B2
(45) Date of Patent: Oct. 9, 2018

(54) SENSOR DEVICE INCLUDING DIODE ELEMENTS CONNECTED IN SERIES IN OPPOSITE DIRECTIONS TO EACH OTHER

(71) Applicant: HITACHI AUTOMOTIVE SYSTEMS, LTD., Hitachinaka-shi, Ibaraki (JP)

(72) Inventors: Masahiro Matsumoto, Tokyo (JP); Hiroshi Nakano, Tokyo (JP); Yoshimitsu Yanagawa, Tokyo (JP); Akira Kotabe, Hitachinaka (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 15 days.

(21) Appl. No.: 15/511,106

(22) PCT Filed: Sep. 16, 2014

(86) PCT No.: PCT/JP2014/074339
§ 371 (c)(1),
(2) Date: Mar. 14, 2017

(87) PCT Pub. No.: WO2016/042592
PCT Pub. Date: Mar. 24, 2016

(65) Prior Publication Data
US 2017/0278838 A1 Sep. 28, 2017

(51) Int. Cl.
*H01L 23/552* (2006.01)
*H01L 27/02* (2006.01)
(Continued)

(52) U.S. Cl.
CPC ........ *H01L 27/0255* (2013.01); *H01L 21/822* (2013.01); *H01L 23/552* (2013.01);
(Continued)

(58) Field of Classification Search
CPC .................. H01L 27/0255; H01L 21/822
(Continued)

(56) References Cited

U.S. PATENT DOCUMENTS

2009/0021873 A1  1/2009 Spode et al.
2010/0245342 A1  9/2010 Kawagoe et al.
(Continued)

FOREIGN PATENT DOCUMENTS

JP  2009-527120 A  7/2009
JP  2010-171134 A  8/2010
JP  2010-232606 A  10/2010

*Primary Examiner* — Caleb Henry
(74) *Attorney, Agent, or Firm* — Foley & Lardner LLP

(57) ABSTRACT

In conventional sensor devices, it has been difficult to achieve both EMC resistance and ESD resistance, which are required at the output terminals of an automobile sensor device. A sensor device 1 of the present embodiment comprises: a power supply terminal 2 that supplies power; a ground terminal 3; a sensor element 4, the electrical characteristics of which change in accordance with a physical quantity; a signal processing integrated circuit 5 that processes an output signal output from the sensor element 4; and an output terminal that outputs the output signal processed by the signal processing integrated circuit 5. In addition, the signal processing integrated circuit 5 comprises: a signal processing circuit 6 that processes the output signal output from the sensor element 4; a resistance element 8 that is connected between the output terminal 11 and the signal processing circuit 6, and that is disposed on an insulating film; diode elements 9, 10 that are connected between the output terminal 11 and the ground terminal 3, and that are serially connected with each other in opposite directions; and a capacitance element 7 that is connected between the ground terminal 3 and the signal processing circuit 6 side of the resistance element 8.

9 Claims, 5 Drawing Sheets

(51) Int. Cl.
*H01L 29/72* (2006.01)
*H01L 29/861* (2006.01)
*H01L 21/822* (2006.01)
*H01L 27/04* (2006.01)

(52) U.S. Cl.
CPC .......... *H01L 27/0288* (2013.01); *H01L 27/04* (2013.01); *H01L 29/72* (2013.01); *H01L 29/861* (2013.01)

(58) Field of Classification Search
USPC ........................................................ 257/659
See application file for complete search history.

(56) References Cited

U.S. PATENT DOCUMENTS

2015/0355260 A1* 12/2015 Franchini ............... G01R 31/04
324/509
2017/0199231 A1* 7/2017 Brunner ............... G01R 15/183

* cited by examiner

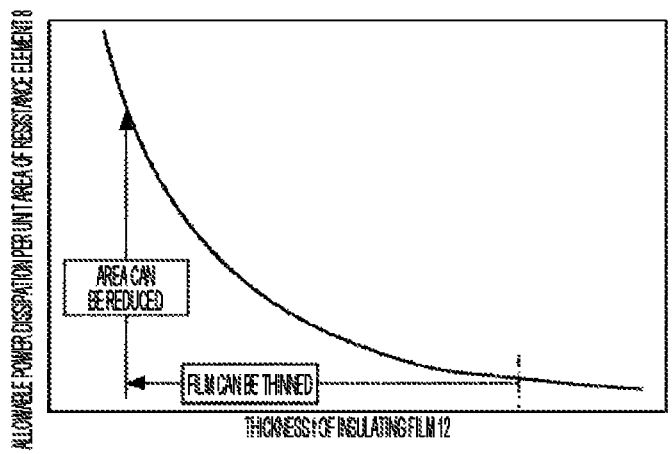
FIG. 9
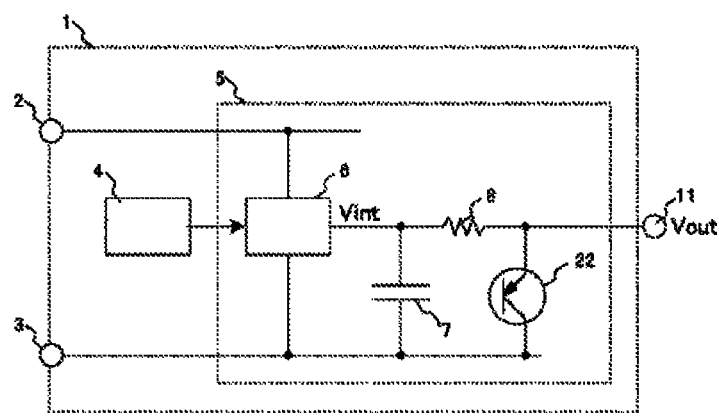
FIG. 10
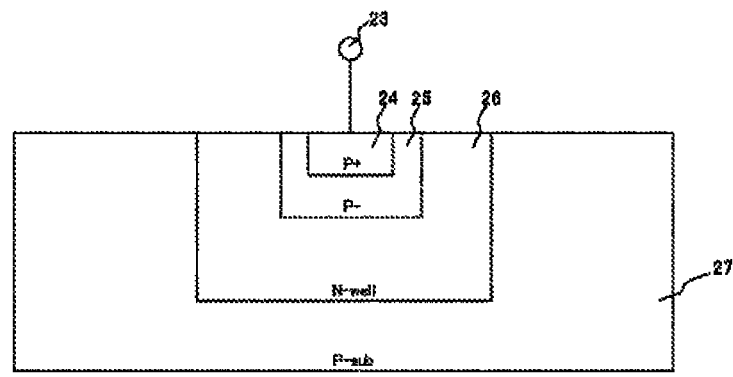

SENSOR DEVICE INCLUDING DIODE ELEMENTS CONNECTED IN SERIES IN OPPOSITE DIRECTIONS TO EACH OTHER

TECHNICAL FIELD

The present invention relates to an automobile sensor device.

BACKGROUND ART

A sensor device including an output terminal with high EMC (Electro Magnetic Compatibility) resistance is recently required. An example of a conventional technique for improving the EMC resistance is a semiconductor integrated circuit described in PTL 1. FIG. 12 illustrates a configuration of a conventional EMC resistance improvement circuit. A conventional EMC resistance improvement circuit 38 includes a power supply terminal 39 for supplying power, a ground terminal 40, an output circuit 41, an output terminal 44 for outputting an output signal from the output circuit 41 to outside, a resistance element 43 arranged between the output circuit 41 and the output terminal 44, and a capacitance element 42 connected between a side of the resistance element 43 closer to the output circuit 41 and the ground terminal 40. PTL 1 discloses that the resistance element 43 is formed by patterning a polysilicon thin film or a metal thin film arranged on an insulating film 45 arranged on a semiconductor substrate 46 as illustrated in FIG. 13.

CITATION LIST

Patent Literature

PTL 1: JP 2010-232606 A

SUMMARY OF INVENTION

Technical Problem

The conventional technique described in PTL 1 needs more consideration on ESD (Electrostatic Discharge) resistance to emission of intense electric waves and application of strong static electricity required in an automobile sensor.

In the automobile sensor device, a several-meter-long cable is connected to the output terminal 44. Also, units generating strong electromagnetic waves, such as an engine and a starter, are provided close to this cable. Due to the electromagnetic waves generated from these units, radio frequency voltage of tens of volts is excited in the cable of the sensor device. Thus, radio frequency voltage of tens of volts is applied to the output terminal 44 as well, which may, in some cases, break the sensor device. Also, in recent automobiles, a motor is used in a drive train, which further increases electromagnetic noise.

FIG. 14 illustrates a waveform in the output terminal 44 when electromagnetic waves are emitted. In FIG. 14, Vint represents output voltage of the output circuit 41, and Vout represents voltage of the output terminal 44. When electromagnetic waves are emitted, radio frequency voltage of tens of volts is superimposed in the output terminal 44 to swing around the voltage Vint. However, a direct-current component of the voltage Vout corresponds to the voltage Vint. Thus, a receiving device of the sensor device can accurately read the output voltage Vint of the output circuit 41 by reading the voltage Vout via an LPF (Low Pass Filter).

Next, resistance to static electricity of the conventional EMC resistance improvement circuit 38 will be described. In the automobile sensor device, static electricity charged in the automobile itself may be applied to the output terminal 44. FIG. 15 illustrates a waveform in the output terminal 44 when static electricity is applied to the output terminal 44. When static electricity is applied, voltage of hundreds of volts is applied to the output terminal 44 albeit briefly. However, in the integrated circuit using a fine process, the insulating film 45 illustrated in FIG. 13 has a tendency toward being thinned, and withstand voltage of the insulating film 45 is lowered. Accordingly, the conventional EMC resistance improvement circuit 38 has a problem in which the resistance element 43 is broken due to application of static electricity.

To cope with this problem, an idea of adding a conventional static electricity protection circuit to the conventional EMC resistance improvement circuit 38 is conceived of. FIG. 16 illustrates a configuration in which the conventional static electricity protection circuit is added to the conventional EMC resistance improvement circuit 38. In this configuration, the conventional EMC resistance improvement circuit illustrated in FIG. 12 is provided as the static electricity protection circuit with a diode element 47 between the output terminal 44 and the power supply terminal 39 and a diode element 48 between the output terminal 44 and the ground terminal 40. In this configuration, adding the diode elements 47 and 48 prevents high voltage from being applied to the resistance element 43 due to application of static electricity. Thus, as illustrated in FIG. 17, even when static electricity is applied, voltage of the output terminal 44 is kept to several volts or less, and breakage of the resistance element 43 can be prevented.

However, a problem occurs in a transition of voltage when electromagnetic waves are emitted. FIG. 18 illustrates a waveform in the output terminal 44 when electromagnetic waves are emitted. In FIG. 18, Vint represents output voltage of the output circuit 41, and Vout represents voltage of the output terminal 44. When electromagnetic waves are emitted, radio frequency voltage of tens of volts is superimposed in the output terminal 44 to swing around the voltage Vint. However, in a case in which voltage of the power supply terminal 39 or higher or voltage of the ground terminal 40 or lower is applied to the output terminal 44, the voltage Vout of the output terminal 44 is clamped by the voltage of the power supply terminal 39 and the voltage of the ground terminal 40 due to the diode elements 47 and 48, and a direct-current component of the voltage Vout does not correspond to the voltage Vint. As a result, the receiving device of the sensor device cannot accurately read the output voltage Vint of the output circuit 41 even by reading the signal of the voltage Vout via the LPF. This phenomenon occurs significantly in a sensor device outputting analog voltage and generates a significant error in a sensor output value. Also, some sensor devices output a frequency value as a sensor signal or generate an output signal by means of a digital communication. In such sensor devices, when the intensity of electric waves to be emitted is high, the signal level of the digital signal changes to go beyond a threshold value, which generates an error in the sensor output signal. Also, when voltage of the output terminal 44 becomes voltage of the power supply terminal 39 or higher, the voltage will intrude into the circuit via the diode element 47, fluctuate power supply voltage of the output circuit 41, and cause malfunction of the output circuit 41.

The present invention is accomplished by taking such problems as mentioned above into consideration thereof, and an object thereof is to provide a sensor device including an output terminal with high EMC resistance and ESD resistance.

Solution to Problem

To achieve the above object, in a sensor device according to the present invention, diode elements connected between an output terminal and a ground terminal and connected in series in opposite directions to each other are connected, and a capacitance element is connected between aside of a resistance element closer to a signal processing circuit and the ground terminal.

Advantageous Effects of Invention

According to the present invention, a sensor device including an output terminal with high EMC resistance and ESD resistance can be provided.

BRIEF DESCRIPTION OF DRAWINGS

FIG. 8 illustrates relationship between the thickness of the insulating film 12 and allowable power dissipation per unit area of the resistance element 8.
FIG. 9 illustrates a configuration of the sensor device according to a second embodiment.
FIG. 10 illustrates a cross-sectional structure of a substrate transistor 22.

DESCRIPTION OF EMBODIMENTS

Figure 1:
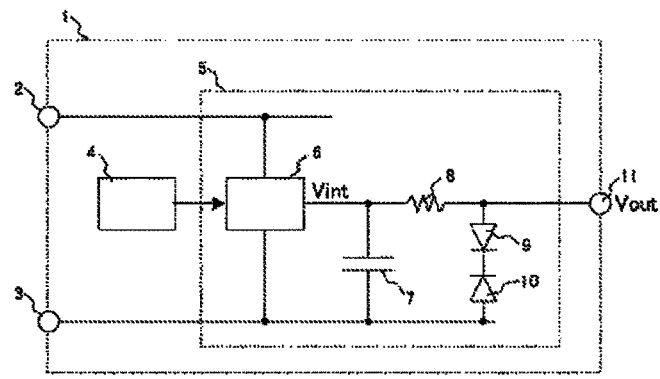
FIG. 1 illustrates a configuration of a sensor device according to a first embodiment.
Figure 2:
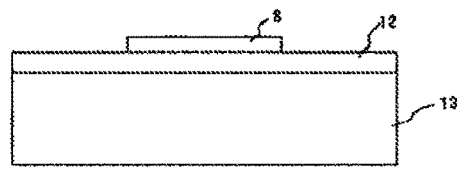
FIG. 2 illustrates a cross-sectional structure of a resistance element 8.
Figure 3:
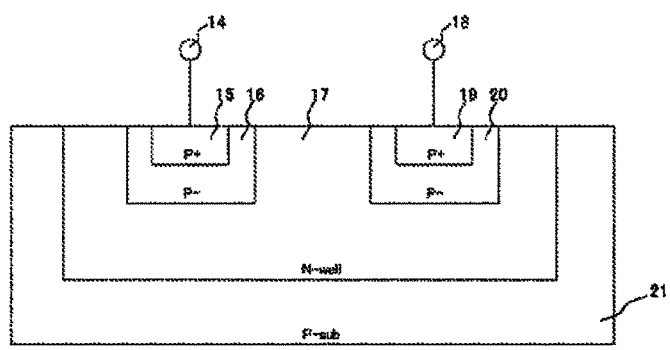
FIG. 3 illustrates a cross-sectional structure of diode elements 9 and 10 connected in series in opposite directions to each other.

Hereinbelow, embodiments of the present invention will be described with reference to the drawings.

First, a sensor device as a first embodiment of the present invention will be described with reference to FIGS. 1 to 8.

A sensor device 1 according to the present embodiment includes a power supply terminal 2 for supplying power, a ground terminal 3, a sensor element 4 in which an electric characteristic changes in accordance with the physical amount, a signal processing integrated circuit 5 for processing an output signal (signal in accordance with the physical amount) from the sensor element 4, and an output terminal 11 for outputting an output signal processed in the signal processing integrated circuit 5. The signal processing integrated circuit 5 includes a sensor signal processing circuit 6 for processing an output signal from the sensor element 4, a resistance element 8 connected between the output terminal 11 and the sensor signal processing circuit 6 and arranged on an insulating film 12, diode elements 9 and 10 connected between the output terminal 11 and the ground terminal 3 and connected to each other in series in opposite directions to each other, and a capacitance element 7 connected between a side of the resistance element 8 closer to the sensor signal processing circuit 6 and the ground terminal 3.

The resistance element 8 is formed by patterning a polysilicon thin film, a silicide thin film, a monocrystal silicon thin film, or a metal thin film arranged on the insulating film 12 arranged on a semiconductor substrate 13. Thus, ground withstand voltage of the resistance element 8 depends on the thickness of the insulating film 12. Meanwhile, the insulating film 12 has a tendency toward being thinned as the integrated circuit becomes finer, and the ground withstand voltage of the resistance element 8 tends to be lowered yearly.

Next, structures of the diode elements 9 and 10 will be described. In the structures of the diode elements 9 and 10, an N-type well layer 17 is arranged on a P-type semiconductor substrate 21, low-concentration P-type diffusion layers 16 and 20 are arranged inside the N-type well layer 17, P-type diffusion layers 15 and 19 are arranged inside the low-concentration P-type diffusion layers 16 and 20, and connection terminals 14 and 18 are provided in the P-type diffusion layers 15 and 19 to enable electric connection. That is, the diode element 9 has a PN-junction constituted by the low-concentration P-type diffusion layer 16 and the N-type well layer 17, and the diode element 10 has a PN-junction constituted by the low-concentration P-type diffusion layer 20 and the N-type well layer 17. In the present configuration, the diode elements 9 and 10 are not arranged in separate N-type well layers but have a lateral transistor structure in which the diode elements 9 and 10 are arranged in one N-type well layer 17. This can reduce the area further than in the case of arranging the diode elements 9 and 10 in separate N-type well layers. Also, the low-concentration P-type diffusion layers 16 and 20 are provided to increase breakdown voltage of the diode elements 9 and 10. Also, since the present structure is the lateral transistor structure, the low-concentration P-type diffusion layers 16 and 20 are provided to lower concentration of the emitter region, to decrease the current amplification factor of the transistor, and to increase withstand voltage between the collector and the emitter. When an integrated circuit becomes finer, the concentration of the diffusion layer increases, and the breakdown voltage decreases. According to the present embodiment, by providing the low-concentration P-type diffusion layers 16 and 20 to obtain high breakdown voltage in a finer integrated circuit, the signal processing integrated circuit 5 can be finer, and the sensor device 1 can be reduced in size and improved in performance.

Figure 4:
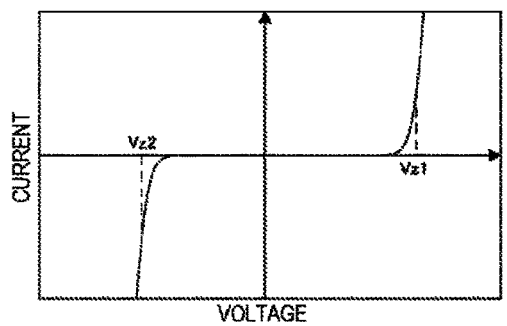
FIG. 4 illustrates volt-ampere characteristics of the diode elements 9 and 10 connected in series in opposite directions to each other.

Also, the diode elements 9 and 10 connected in series in the opposite directions to each other have volt-ampere characteristics in which current drastically increases due to breakdown voltage Vz1 of the diode element 10 and breakdown voltage Vz2 of the diode element 9 as illustrated in FIG. 4. In the present embodiment, each of Vz1 and Vz2 is set to be lower than the ground withstand voltage of the resistance element 8 and to be higher than fluctuating voltage of the output terminal 11 caused by emission of electric waves.

Figure 5:
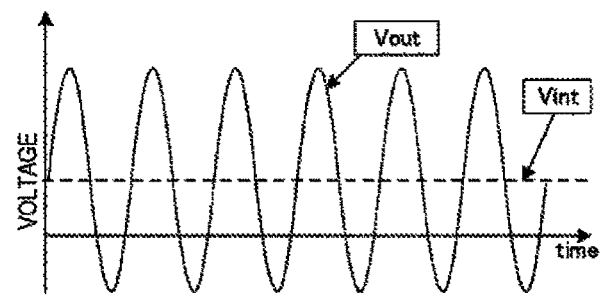
FIG. 5 illustrates a voltage waveform in an output terminal 11 at the time of emission of electric waves.

Next, FIG. 5 illustrates a waveform in the output terminal 11 when electromagnetic waves are emitted to the sensor device 1. In FIG. 5, Vint represents output voltage of the sensor signal processing circuit 6, and Vout represents voltage of the output terminal 11. As illustrated in FIG. 5, radio frequency voltage of tens of volts is superimposed in the output terminal 11 to swing around the voltage Vint. However, since each of Vz1 of the diode element 9 and Vz2 of the diode element 10 is set to be higher than voltage to be superimposed in the output terminal 11, the waveform of the voltage Vout is not clamped. Thus, a direct-current component of the voltage Vout corresponds to the voltage Vint. Also, while the frequency of the radio frequency voltage to be superimposed in the output terminal 11 by emission of electric waves is at least 10 MHz or higher, the signal band of output signals of the sensor device 1 is 100 kHz or lower. Thus, a receiving device of the sensor device can read the output voltage of the sensor device with no errors by reading the output signal Vout via an LPF. Also, in the sensor device 1, there is no electric connection between the output terminal 11 and the power supply terminal 2. Thus, there is no possibility that fluctuating voltage of the output terminal 11 will intrude into the power supply terminal 2. Accordingly, there is no possibility that power supply voltage of the sensor signal processing circuit 6 will fluctuate to cause the sensor signal processing circuit 6 to malfunction. That is, even when radio frequency voltage is superimposed in the output terminal 11 due to emission of electric waves, the sensor signal processing circuit 6 can be operated in a stable manner.

Figure 6:
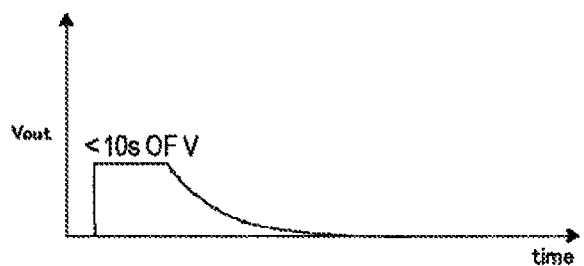
FIG. 6 illustrates a voltage waveform in the output terminal 11 at the time of application of static electricity.

Next, a waveform of the output signal Vout when static electricity is applied to the output terminal 11 is illustrated in FIG. 6. When static electricity is applied to the sensor device 1, voltage in the output terminal 11 is clamped by Vz1 of the diode element 9 and Vz2 of the diode element 10. As a result, voltage in the output terminal 11 is suppressed to tens of volts or less. Also, in the present embodiment, since each of Vz1 of the diode element 9 and Vz2 of the diode element 10 is set to be lower than the ground withstand voltage of the resistance element 8, breakage of the resistance element 8 can be prevented.

Figure 7:
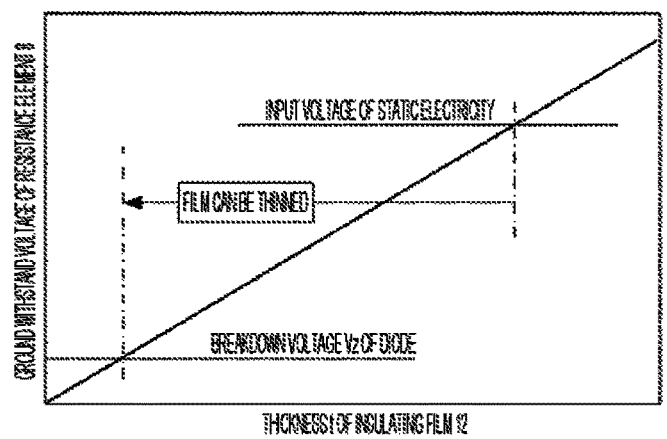
FIG. 7 illustrates relationship between the thickness of an insulating film 12 and ground withstand voltage of the resistance element 8.

Next, an additional advantage of the sensor device 1 will be described with reference to FIG. 7. FIG. 7 illustrates relationship between the thickness t of the insulating film 12 and the ground withstand voltage of the resistance element 8. In the sensor device 1, since the diode elements 9 and 10 connected in series in the opposite directions to each other are connected between the output terminal 11 and the ground terminal 3, application of high voltage generated by static electricity or the like to the resistance element 8 can be restricted. This enables the insulating film 12 to be thinner, and a finer integrated circuit can be applied to the signal processing integrated circuit 5 of the sensor device 1, which can contribute to size reduction and performance improvement of the sensor device 1.

Also, as illustrated in FIG. 8, the thinner the insulating film 12 is, the further the allowable power dissipation per unit area of the resistance element 8 can be improved. The reason for this is that, since most of the heat of the resistance element 8 dissipates via the insulating film 12 into the semiconductor substrate 13, the heat dissipation property of the resistance element 8 is improved further as the insulating film 12 gets thinner. Also, the resistance element 8 functions to absorb voltage fluctuation in the output terminal 11 at the time of emission of electric waves to protect the sensor signal processing circuit 6. That is, since the resistance element 8 is heated by voltage fluctuation in the output terminal 11, the resistance element 8 is required to have sufficient allowable power dissipation. The resistance element 8 functions to absorb voltage fluctuation in the output terminal 11 at the time of application of static electricity as well to protect the sensor signal processing circuit 6. That is, since the resistance element 8 is heated by voltage fluctuation in the output terminal 11 caused by static electricity, the resistance element 8 is required to have sufficient allowable power dissipation. Heat generation caused by static electricity is particularly significant, and it is more than 1000 watts albeit briefly. Also, since the heat conductivity of the insulating film 12 is generally low, the allowable power dissipation of the resistance element 8 on the insulating film 12 is lower than diffusion resistance. As a result, the resistance element 8 needs to be large in area, and area reduction of the resistance element 8 is a major issue. In the sensor device 1, since the insulating film 12 can be thinned as described above, the allowable power dissipation per unit area of the resistance element 8 can be improved, and area reduction of the resistance element 8 can be achieved.

In the sensor device 1, the sensor signal processing circuit 6, the resistance element 8, the diode elements 9 and 10, and the capacitance element 7 are arranged in the same signal processing integrated circuit 5. Thus, the resistance element 8 and the diode elements 9 and 10 can be integrated. As a result, application of high voltage to the resistance element 8 due to static electricity to be applied to the output terminal of the signal processing integrated circuit 5 at the time of assembling the sensor device 1 can be prevented by the diode elements 9 and 10. That is, even in a case in which the insulating film 12 is thinned to improve the allowable power dissipation of the resistance element 8, breakage of the resistance element 8 due to the static electricity to be applied at the time of assembling can be prevented.

In the sensor device 1, a polysilicon thin film is employed as the resistance element 8, for example. The polysilicon thin film is easy to process and is generally used in an integrated circuit. Thus, the polysilicon thin film is advantageous in that no special process needs to be added.

Also, by using a silicide thin film or a high-melting-point metal thin film as the resistance element 8, the allowable power dissipation per unit area of the resistance element 8 can be improved. The reason for this is that the melting point of the silicide or the high-melting-point metal is higher than that of the polysilicon. By using the silicide thin film or the high-melting-point metal thin film as the resistance element 8, the area of the resistance element 8 can be reduced.

Next, the sensor device according to a second embodiment of the present invention will be described with reference to FIGS. 9 and 10. The sensor device according to the second embodiment basically has an equal configuration to that of the sensor device according to the first embodiment except that the diode elements 9 and 10 are replaced with a substrate transistor 22. It is to be noted that description of the duplicate components with those in the first embodiment is omitted.

The substrate transistor 22 is configured by arranging an N-type well layer 26 on a P-type semiconductor substrate 27, arranging a low-concentration P-type diffusion layer 25 and a P-type diffusion layer 24 inside the N-type well layer 26, and arranging a connection terminal 23. That is, the diode element 9 has a PN-junction constituted by the low-concentration P-type diffusion layer 25 and the N-type well layer 26, and the diode element 10 has a PN-junction constituted by the N-type well layer 26 and the P-type semiconductor substrate 27. In the present configuration, the number of the diffusion layers is reduced further than that in the first embodiment to achieve area reduction. Also, the low-concentration P-type diffusion layer 25 is provided to lower concentration of the emitter region of the substrate transistor, to decrease the current amplification factor of the transistor, and to increase withstand voltage between the collector and the emitter.

Figure 11:
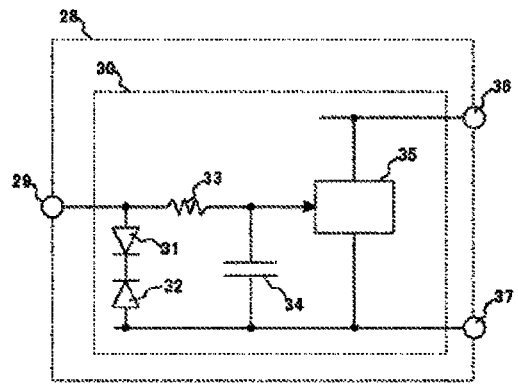
FIG. 11 illustrates a configuration of a receiving device of a sensor device according to a third embodiment.
Figure 12:
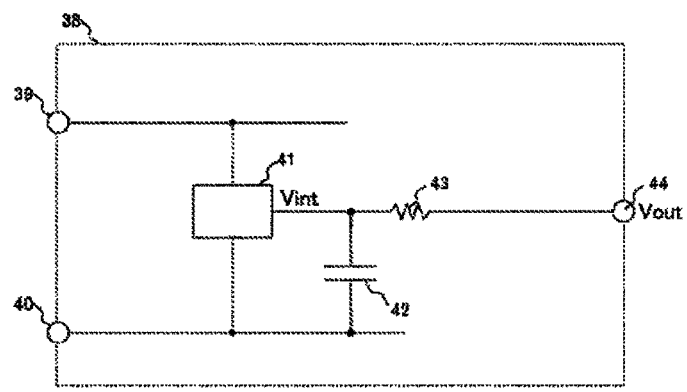
FIG. 12 illustrates a configuration of a conventional EMC resistance improvement circuit.
Figure 13:
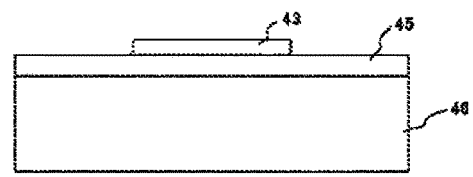
FIG. 13 illustrates a cross-sectional structure of a resistance element 40.
Figure 14:
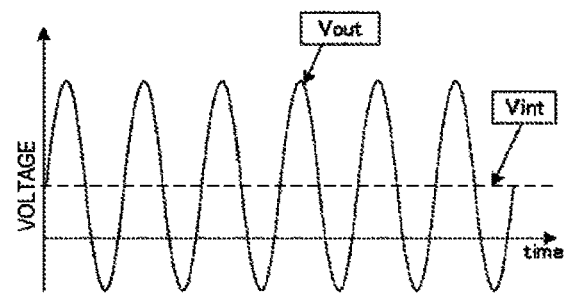
FIG. 14 illustrates a waveform in an output terminal 44 when electromagnetic waves are emitted.
Figure 15:
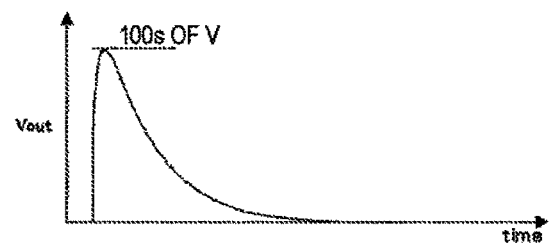
FIG. 15 illustrates a waveform in the output terminal 44 when static electricity is applied to the output terminal 44.
Figure 16:
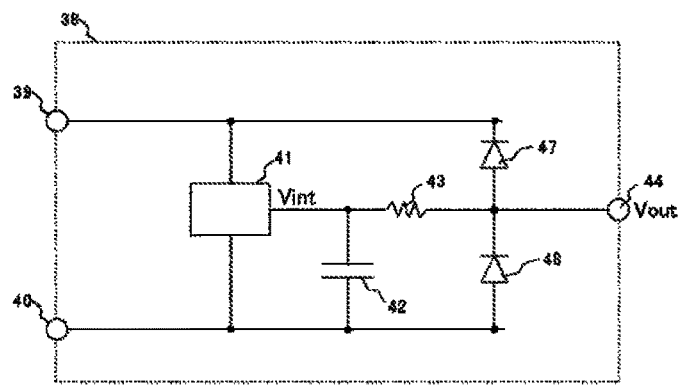
FIG. 16 illustrates a configuration in which a conventional static electricity protection circuit is added to the conventional EMC resistance improvement circuit.
Figure 17:
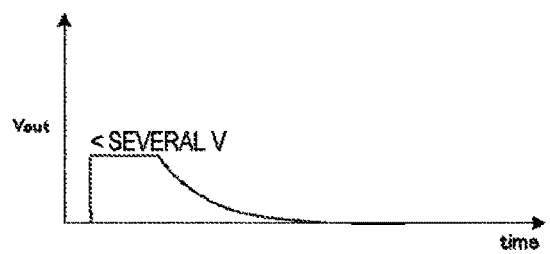
FIG. 17 illustrates a waveform in the output terminal 44 when static electricity is applied to the output terminal 44.
Figure 18:
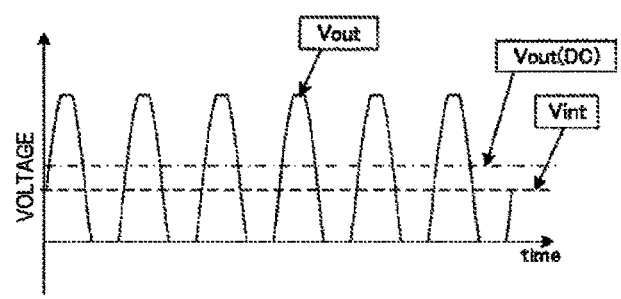
FIG. 18 illustrates a waveform in the output terminal 44 when electromagnetic waves are emitted.

Next, a receiving device of a sensor device according to a third embodiment of the present invention will be described with reference to FIG. 11.

A receiving device 28 of a sensor device according to the present embodiment includes a power supply terminal 36 for supplying power, a ground terminal 37, a receiving terminal 29 for receiving a signal from the sensor device, and a signal processing integrated circuit 30 for processing a signal received from the sensor device. The signal processing integrated circuit 30 includes a sensor signal processing circuit 35 for processing a signal received from the sensor device, a resistance element 33 connected between the receiving terminal 29 and the sensor signal processing circuit 35 and arranged on an insulating film, diode elements 31 and 32 connected between the receiving terminal 29 and the ground terminal 37 and connected to each other in series in opposite directions to each other, and a capacitance element 34 connected between aside of the resistance element 33 closer to the sensor signal processing circuit 35 and the ground terminal 37. The effect of the sensor device side has been described in the first embodiment, and a similar effect to that of the sensor device side can be obtained in the receiving device side of the sensor device.

REFERENCE SIGNS LIST

1 . . . sensor device, 2 power supply terminal, 3 . . . ground terminal, 4 . . . sensor element, 5 . . . signal processing integrated circuit, 6 . . . sensor signal processing circuit, 7 . . . capacitance element, 8 . . . resistance element, 9 . . . diode element, 10 . . . diode element, output terminal, 12 . . . insulating film, 13 . . . semiconductor substrate, 14 . . . connection terminal, 15 . . . P-type diffusion layer, 16 . . . low-concentration P-type diffusion layer, 17 . . . N-type well layer, 18 . . . connection terminal, 19 . . . P-type diffusion layer, 20 . . . low-concentration P-type diffusion layer, 21 . . . P-type semiconductor substrate, 22 . . . substrate transistor, 23 . . . connection terminal, 24 . . . P-type diffusion layer, 25 . . . low-concentration P-type diffusion layer, 26 . . . N-type well layer, 27 . . . P-type semiconductor substrate, 28 . . . receiving device of sensor device, 29 . . . receiving terminal, 30 . . . signal processing integrated circuit, 31 . . . diode element, 32 . . . diode element, 33 . . . resistance element, 34 . . . , 35 . . . sensor signal processing circuit, 36 . . . power supply terminal, 37 . . . ground terminal, 38 . . . conventional EMC resistance improvement circuit, 39 . . . power supply terminal, 40 . . . ground terminal, 41 . . . output circuit, 42 . . . capacitance element, 43 . . . resistance element, output terminal, 45 . . . insulating film, 46 . . . semiconductor substrate, 47 . . . diode element, 48 . . . diode element

The invention claimed is:

1. A sensor device including a signal processing circuit for processing a signal in accordance with the physical amount, an output terminal for outputting an output signal processed in the signal processing circuit, a power supply terminal for supplying power to the signal processing circuit, and a ground terminal, the sensor device comprising:
 a resistance element connected between the output terminal and the signal processing circuit;
 a capacitance element connected between a side of the resistance element closer to the signal processing circuit and the ground terminal; and
 diode elements connected between the output terminal and the ground terminal and connected in series in opposite directions to each other.

2. The sensor device according to claim 1, wherein Zener voltage of the diode element is lower than ground withstand voltage of the resistance element and higher than fluctuating voltage of the output terminal caused by emission of electric waves.

3. The sensor device according to claim 1, wherein the signal processing circuit, the resistance element, the diode elements, and the capacitance element are arranged in an equal integrated circuit.

4. The sensor device according to claim 1, wherein the diode elements connected in series in opposite directions to each other have a lateral transistor structure.

5. The sensor device according to claim 4, wherein an emitter region of the lateral transistor structure is provided with a low-concentration layer.

6. The sensor device according to claim 1, wherein the diode elements connected in series in opposite directions to each other have a substrate transistor structure.

7. The sensor device according to claim 6, wherein an emitter region of the substrate transistor structure is provided with a low-concentration layer.

8. The sensor device according to claim 1, wherein the resistance element is any of a polysilicon thin film, a silicide thin film, a metal thin film, and a monocrystal silicon thin film.

9. A receiving device including an input terminal for causing an input signal from outside to be input therein, a signal processing circuit for processing the input signal, a power supply terminal for supplying power to the signal processing circuit, and a ground terminal, the receiving device comprising:
 a resistance element connected between the input terminal and the signal processing circuit;
 a capacitance element connected between a side of the resistance element closer to the signal processing circuit and the ground terminal; and
 diode elements connected between the input terminal and the ground terminal and connected in series in opposite directions to each other.

* * * * *